United States Patent [19]
Satoh et al.

[11] Patent Number: 5,631,113
[45] Date of Patent: May 20, 1997

[54] ELECTRON-BEAM EXPOSURE SYSTEM FOR REDUCED DISTORTION OF ELECTRON BEAM SPOT

[75] Inventors: Takamasa Satoh; Hiroshi Yasuda; Akio Yamada; Junichi Kai; Yoshihisa Oae; Keiji Yamada; Toru Oshima, all of Kawasaki, Japan

[73] Assignees: Fujitsu Limited, Kawasaki; Fujitsu VLSI Limited, Kasugai, both of Japan

[21] Appl. No.: 435,157

[22] Filed: May 5, 1995

Related U.S. Application Data

[62] Division of Ser. No. 319,022, Oct. 6, 1994, Pat. No. 5,444,257.

[30] Foreign Application Priority Data

Dec. 28, 1993 [JP] Japan ..................................... 5-337223

[51] Int. Cl.⁶ .................................. G03L 5/00; H01J 37/00
[52] U.S. Cl. ........................... 430/30; 250/398; 250/492.2
[58] Field of Search ............................ 430/30; 250/398, 250/492.2

[56] References Cited

U.S. PATENT DOCUMENTS

| | | | |
|---|---|---|---|
| 4,523,098 | 6/1985 | Noma | 250/492.2 |
| 4,763,004 | 8/1988 | Yasuda | 250/396 R |
| 5,036,209 | 7/1991 | Kataoka et al. | 250/492.2 |
| 5,304,811 | 4/1994 | Yamada et al. | 250/492.22 |
| 5,313,062 | 5/1994 | Yamada | 250/397 |
| 5,391,886 | 2/1995 | Yamada et al. | 250/398 |

*Primary Examiner*—Mark Chapman
*Attorney, Agent, or Firm*—Staas & Halsey

[57] ABSTRACT

An electron-beam exposure system includes an astigmatic compensation circuit that increases a voltage applied across a pair of electrodes forming an electrostatic sub-deflector and simultaneously decreases a voltage applied across another pair of electrodes forming the same electrostatic sub-deflector with a same magnitude as in the case of increasing the voltage, wherein the magnitude of the voltage change is changed in response to the deflection of the electron-beam caused by a main deflector.

6 Claims, 10 Drawing Sheets

ELECTRON-BEAM EXPOSURE SYSTEM FOR REDUCED DISTORTION OF ELECTRON BEAM SPOT

This application is a division of application Ser. No. 08/319,022, filed Oct. 6, 1994, now U.S. Pat. No. 5,444,257.

BACKGROUND OF THE INVENTION

The present invention generally relates to fabrication of semiconductor devices and, more particularly, to an electron-beam exposure system that exposes a semiconductor pattern on an object such as a semiconductor substrate by means of a charged particle beam, such as an electron-beam.

Electron beam lithography is an indispensable technology for fabricating leading edge semiconductor devices having a very large integration density. By using electron-beam lithography, it is possible to expose a pattern having a width of 0.05 μm or less with an alignment error of 0.02 μm or less. Thus, it is expected that electron-beam lithography will play a central role in the fabrication of future semiconductor devices, such as a large capacity DRAM having a storage capacity exceeding 256 Mbits or 1 Gbits, or a high speed microprocessor having extremely powerful arithmetic functions.

Figure 1:
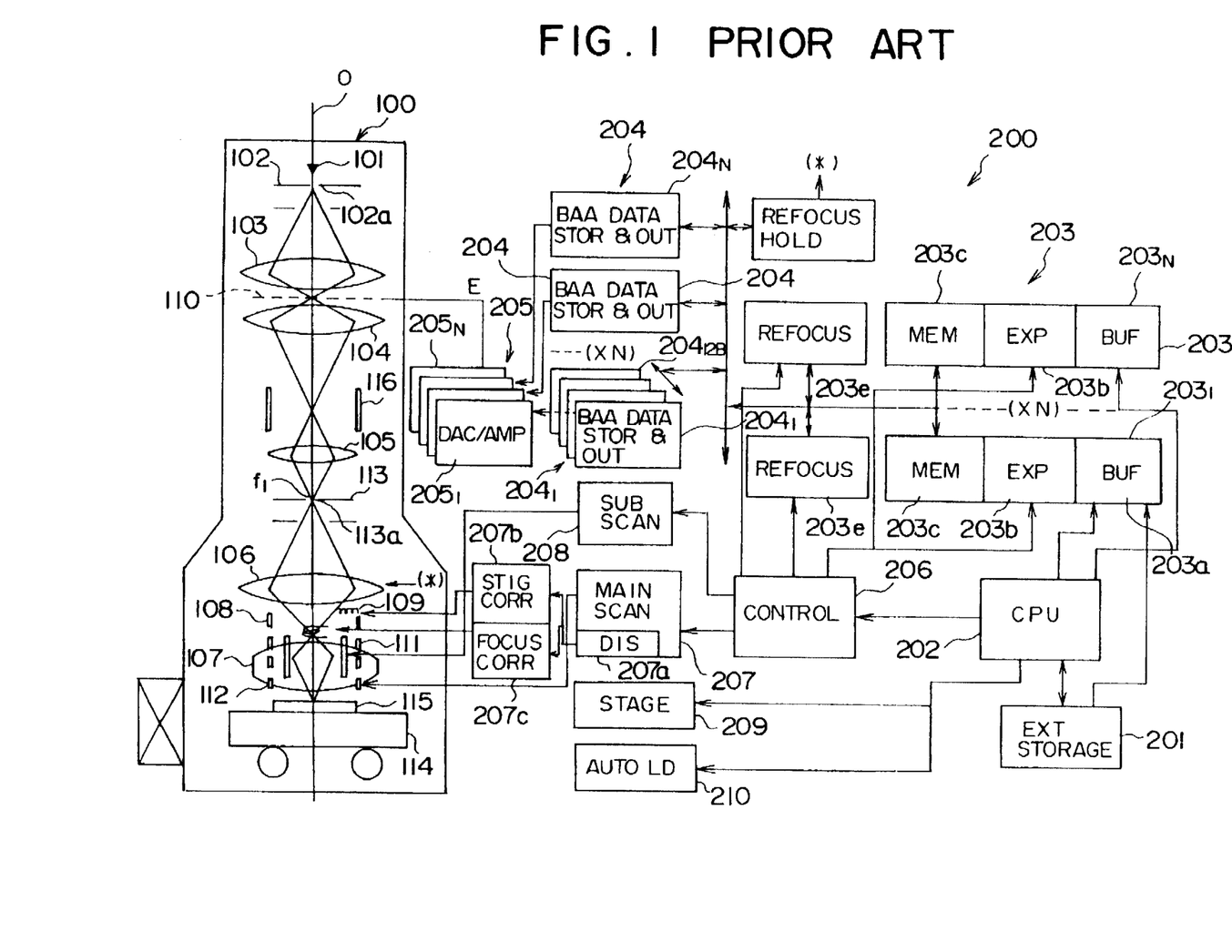
FIG. 1 is a diagram showing the overall construction of a conventional electron-beam exposure system.

FIG. 1 shows a schematic view of a conventional electron-beam exposure system using a blanking aperture array. Referring to FIG. 1, the electron-beam exposure system is generally formed of an electron optical system 100 for producing a focused electron-beam and a control system 200 that controls the electron optical system 100. The electron optical system 100 includes an electron gun 101 as an electron-beam source, and the electron gun 101 emits an electron-beam in the form of a divergent beam along a predetermined optical axis O.

The electron-beam thus produced by the electron gun 101 is shaped by an aperture 102a provided on an aperture plate 102, wherein the aperture 102a is provided in alignment with the optical axis O and shapes the electron-beam incident there, so as to have a rectangular cross section.

The shaped electron-beam thus formed is focused upon the BAA (blanking aperture array) mask 110 by an electron lens 103, wherein the BAA mask 110 carries thereon a blanking aperture array. Thus, the electron lens 103 projects an image of the aforementioned rectangular aperture 102a upon the BAA mask 110. The BAA mask 110 carries a plurality of small apertures corresponding to exposure dots to be formed on a semiconductor substrate 115 in the form of BAA, and an electrostatic deflector is provided on the BAA mask 110 in correspondence to each of such apertures. The electrostatic deflector is controlled by a driving signal E such that an aperture cooperating with the electrostatic deflector passes the electron-beam directly therethrough in a non-activated state of the electrostatic deflector, while in the activated state, the electrostatic deflector deflects the electron-beam passing through the aperture away from the optical axis O. As a result, there is formed an exposure dot pattern on the semiconductor substrate 115 in correspondence to the non-activated apertures of the BAA mask 110.

The electron-beam, having passed through the BAA mask 110, is focused at a focal point $f_1$ on the optical axis O after passing through the electron lenses 104 and 105 that form a demagnifying optical system, and the image of the selected apertures is formed at the focal point $f_1$. The focused electron-beam is further focused on the semiconductor substrate 115, held on a movable stage 114, by electron lenses 106 and 107 that form another demagnifying optical system, after passing through a round aperture 113a provided on a round aperture plate 113. Thus, an image of the BAA mask 110 is projected on the substrate 115. Here, the electron lens 107 acts as an objective lens and includes therein various correction coils 108 and 109 for correcting the focal point and aberrations as well as deflectors 111 and 112 for moving the focused electron-beam over the surface of the substrate 115.

Between the lens 104 and lens 105, there is provided an electrostatic deflector 116, wherein the electrostatic deflector 116 deviates, upon activation, the path of the electron-beam from the optical axis O, which is set to pass through the round aperture 113a on the plate 113. As a result, it becomes possible to switch the electron-beam on and off at a high speed on the semiconductor substrate 115 by energizing the electrostatic deflector 116. Further, it should also be noted that the electron beams on the BAA mask 110, described above, deviate also from the round aperture 113a. Therefore, the electron beams thus deflected do not reach the semiconductor substrate, and it becomes possible to control the exposure dot pattern on the substrate 115 in response to the energization of the BAA mask 110.

In order to control such an exposure operation, the electron-beam exposure system of FIG. 1 uses the aforementioned control system 200. The control system 200 includes an external storage device 201, such as a magnetic disk device or a magnetic tape device, for storing data relating to the patterns of the semiconductor device to be exposed.

The data stored in the storage device 201 is read out by a CPU 202, and the data compression thereof is removed by a data expansion circuit 203 that includes a buffer memory 203a, a data expansion unit 203b and a canvas memory 203c. As a result of the expansion, exposure data is converted to exposure dot data that switches the individual apertures on the BAA mask 110 on and off according to the desired exposure pattern.

In order to achieve a delicate correction of the exposure pattern, the electron-beam exposure system of FIG. 1 conducts a multiple exposure of the exposure dots on the substrate 115, such that the exposure is superposed N times, each time with an independent exposure pattern. For this purpose, the data expansion circuit 203 includes N identical circuits $203_1$ to $203_N$, wherein each of the circuits $203_1$ to $203_N$ produces, based upon the exposure data provided from the CPU 202, N sets of mutually independent exposure dot pattern data used for carrying out the foregoing multiple exposures to be superposed N times. The dot pattern thus obtained is then supplied to the BAA mask 110 via driving circuits 204 and 205 provided in correspondence to each of the apertures on the BAA mask 110, for driving the electrostatic deflector provided on each of the apertures on the BAA mask 110. Thereby, the BAA mask 110 shapes the electron-beam incident thereto and produces an electron-beam bundle that forms the desired exposure dots according to the desired exposure pattern.

The electron-beam thus shaped is deflected by the main deflector 111 and the sub-deflector 112 respectively driven by a main deflection control circuit 207 and a sub-deflection control circuit 208 under control of an exposure control unit 206, such that the electron-beam scans over the surface of the substrate 115. It should be noted that the main deflection control circuit 207 is supplied with main deflection data from the exposure control unit 206 and produces a drive current signal that drives the main deflector 111. On the other hand, the sub-deflection control circuit 208 is supplied with sub-deflection data from the exposure control unit 206 and produces a drive voltage signal that drives the sub-deflector 112.

The main deflection control circuit 207 further includes a distortion correction circuit 207a, wherein the distortion correction circuit 207a compensates for the astigmatism by driving the correction coil 109 via an astigmatic correction circuit 207b. Further, the correction circuit 207a achieves the focusing compensation by driving the focusing correction coil 108 via a focusing correction circuit 207c.

In addition, the system of FIG. 1 is equipped with a refocus control circuit 203e for compensating for the divergence of the focused electron-beam as a result of Coulomb repulsion, wherein the refocus control circuit 203e adjusts the strength of the electron lens 106 in response the exposure dot pattern.

Figure 2A:
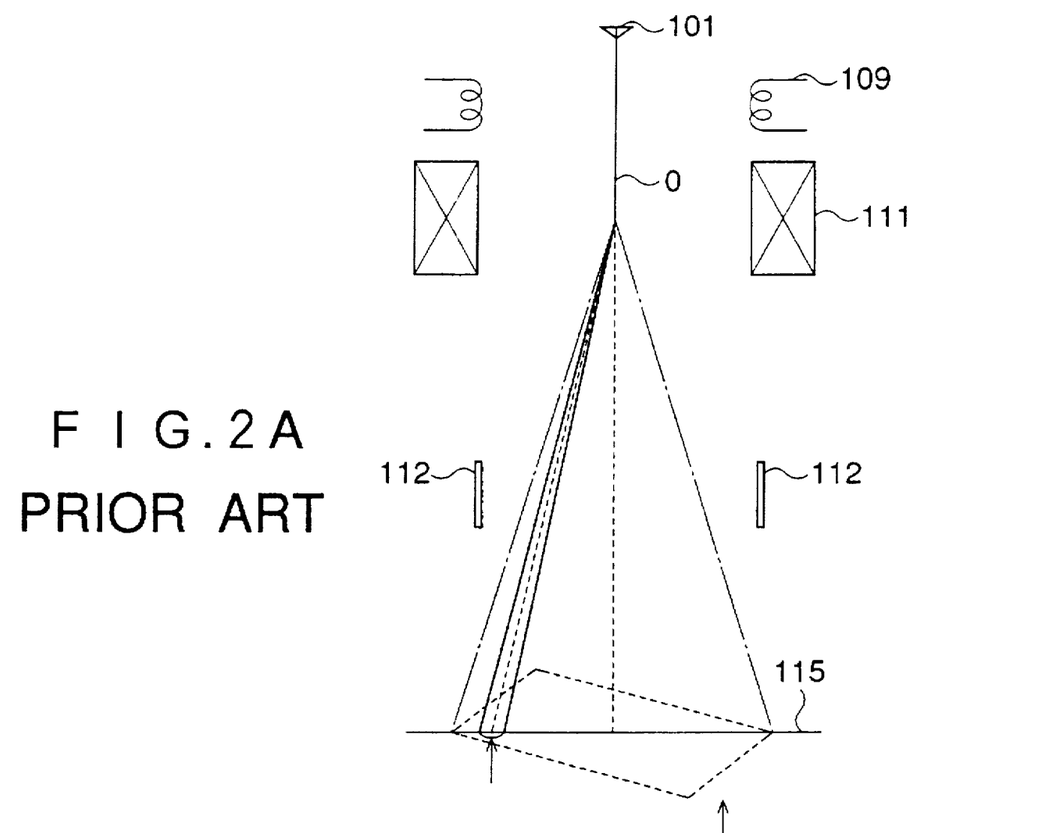
FIGS. 2A and 2B are diagrams showing the operation of sub-deflectors used in the electron-beam exposure system of FIG. 1.

FIG. 2A shows the function of the main deflector 111 and the sub-deflector 112 in the electron-beam exposure system of FIG. 1. In FIG. 2A, it should be noted that the electron optical system of FIG. 1, that is located at the upstream side of the objective lens 107, is omitted from the illustration for the sake of simplicity.

Figure 2B:
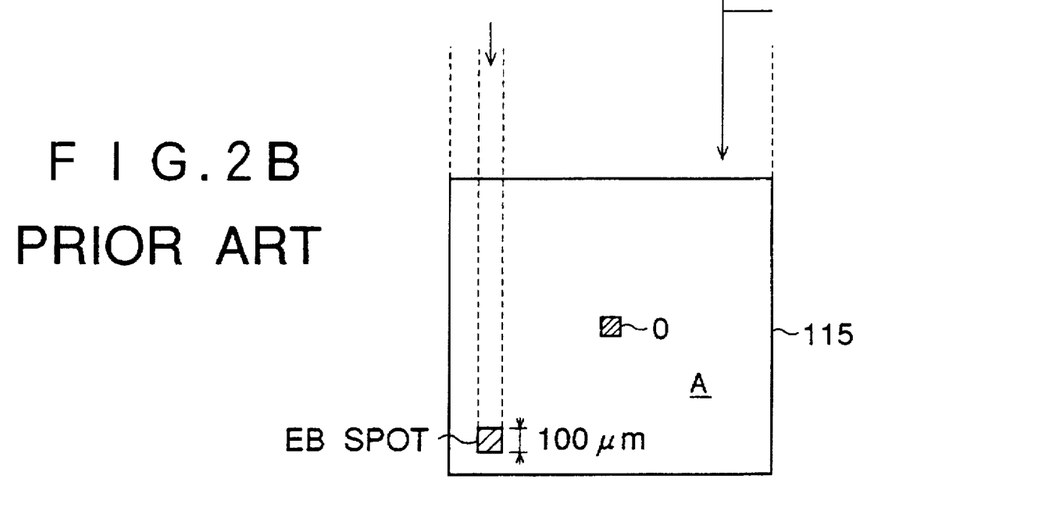

Referring to FIG. 2A, the electron-beam incident to the objective lens 107 is deflected by the main and sub-deflectors 111 and 112 and moves over the surface of the substrate 115. It should be noted that the main deflector 111 is formed of an electromagnetic deflector as usual and covers a relatively large main deflection area A having a size of about 5 mm×5 mm as indicated in FIG. 2B. On the other hand, the sub-deflector 112 is formed of an electrostatic deflector and covers a relatively small sub-deflection area typically having a size of 100 μm×100 μm. It should be noted that FIG. 2B shows the exposure achieved on the surface of the substrate 115.

In operation, the electromagnetic deflector is energized to deflect the electron-beam over the substrate 115, such that a desired sub-deflection area is selected from a main deflection area in which a number of sub-deflection areas are included. Next, the sub-deflector 112 is energized such that the electron-beam is moved over the selected sub-deflection area at a high speed, and the exposure pattern is formed as a result of such a scanning of the electron-beam. Generally, the electromagnetic deflector exhibits a slow response, due to the inductance of the coil forming the deflector, while the operation of the electrostatic deflector is very fast.

It should be noted that such construction and operation of the main and sub-deflectors are more or less the same in other general electron-beam exposure systems. A more complete description of the electron-beam exposure system of FIG. 1 can be seen in the U.S. patent application Ser. No. 08/241,409, which is incorporated herein as reference.

Figure 3A:
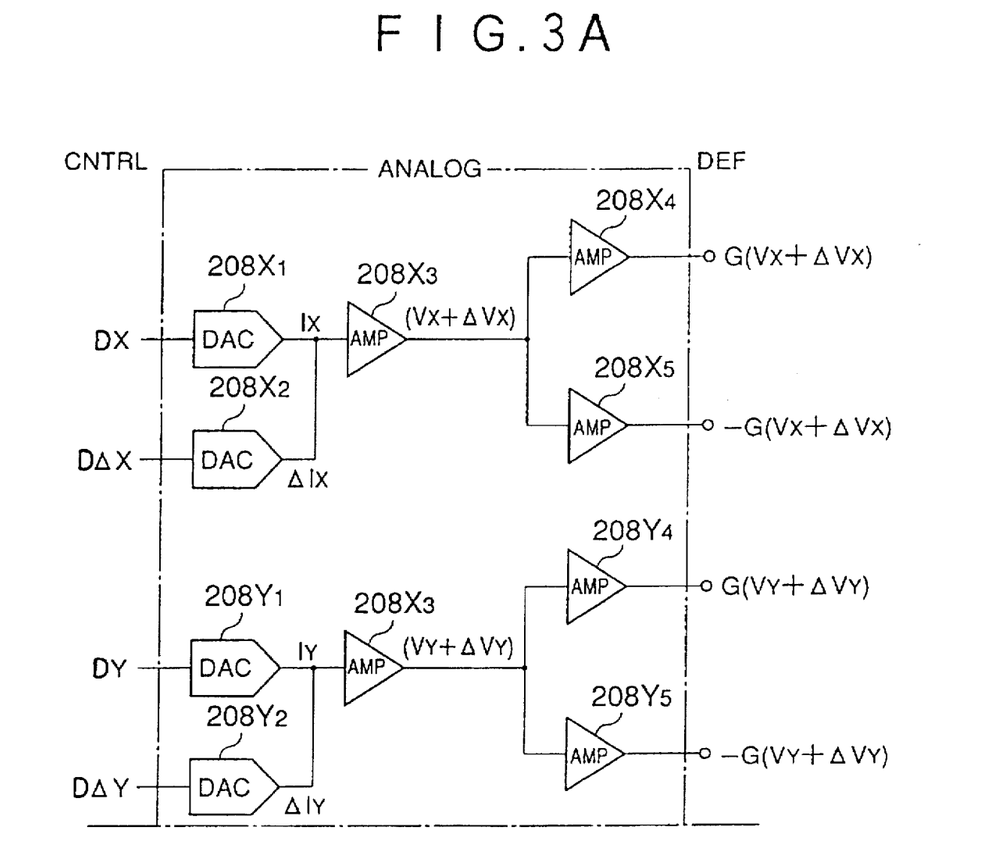
FIGS. 3A and 3B are circuit diagrams showing the construction of driving circuits used for driving the sub-deflectors shown in FIG. 2A.
Figure 3B:
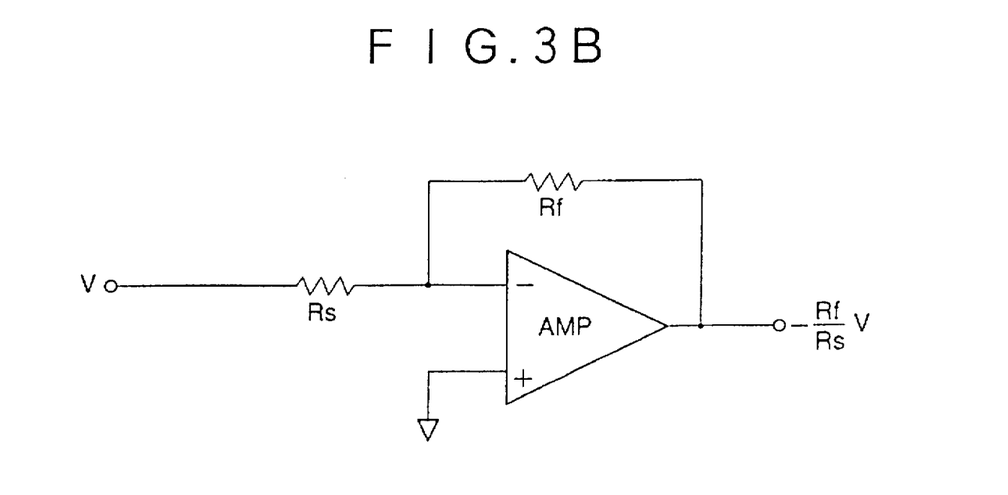

FIGS. 3A and 3B show the construction of the conventional drive circuit that drives the sub-deflector 112 of FIG. 2A, wherein it should be noted that the circuit of FIG. 3A corresponds to the sub-deflection control circuit 208 of FIG. 1.

Referring to FIG. 3A, the sub-deflector 112 is formed of an X-deflection system that deflects the electron-beam in an X-direction and a Y-deflection system that deflects the electron-beam in a Y-direction that is perpendicular to the X-direction. The X-deflection system includes a D/A converter 208X$_1$ supplied with sub-deflection data DX indicative of the magnitude of deflection of the electron-beam in the X-direction, for converting the same to an analog signal Ix, and a D/A converter 208X$_2$ supplied with sub-deflection correction data D$_\Delta$X indicative of the deviation of the electron-beam due to the vibration of the stage or vortex current or the effect of the ECC correction, for converting the same to an analog signal $_\Delta$Ix. The X-deflection system further includes an amplifier 208X$_3$ supplied with the analog signals Ix and $_\Delta$Ix for producing a sum signal V$_x$+$_\Delta$V$_x$, an output amplifier 208X$_4$ for producing a drive voltage signal G(V$_x$+$_\Delta$V$_x$) to be supplied to a first electrode plate of the electrostatic deflector by amplifying the foregoing sum signal with a gain G, and another output amplifier 208X$_5$ that amplifies the foregoing sum signal with a gain −G to produce a drive voltage signal −G(V$_x$+$_\Delta$V$_x$) that is supplied to a second, opposing electrode plate of the electrostatic deflector. Thereby voltages G(V$_x$+$_\Delta$V$_x$) and −G(V$_x$+$_\Delta$V$_x$) are applied across a pair of electrodes opposite with each other in the X-direction. Further, a similar construction is provided for the Y-deflection system.

FIG. 3B shows the actual construction of an amplifier 208 corresponding to each of the amplifiers 208X$_4$ and 208X$_5$ or 208Y$_4$ and 208Y$_5$. As will be noted from FIG. 3B, the amplifier is formed of an operational amplifier having a feedback loop that provides a stabilized gain determined by the resistances Rs and Rf.

When the electron-beam is deflected by the main deflector in the electron optical system of FIG. 2A, the electron-beam inevitably deviates from the optical axis O. Thereby, there arises a problem of astigmatism in the electron-beam in that the electron-beam spot on the substrate 115 tends to be distorted as a result of such astigmatism. Associated with such a distortion of the electron-beam spot, there may also occur a change in the size of the beam spot. While such an astigmatism may be compensated for by the compensation coil 109 shown in FIG. 2A, there still occurs a problem of distortion of the electron-beam, when the beam deflected by the main deflector 111 is further deflected by the sub-deflector 112, due to a non-uniform electric field inside the electrostatic deflector. It should be noted that the electron-beam thus deflected passes in the vicinity of the electrode plate of the electrostatic deflector where the distribution of the electric field is not uniform.

Figure 4A:
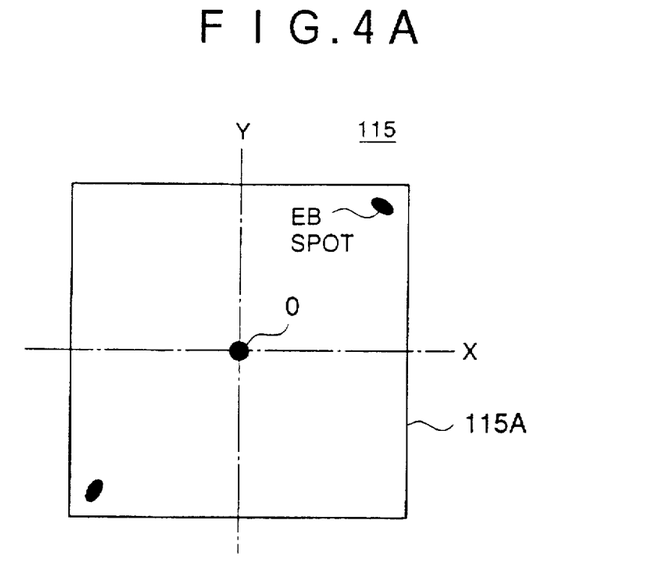
FIGS. 4A and 4B are diagrams showing the distortion of the electron-beam occurring in the conventional electron-beam exposure system for two different settings of the main deflector.
Figure 4B:
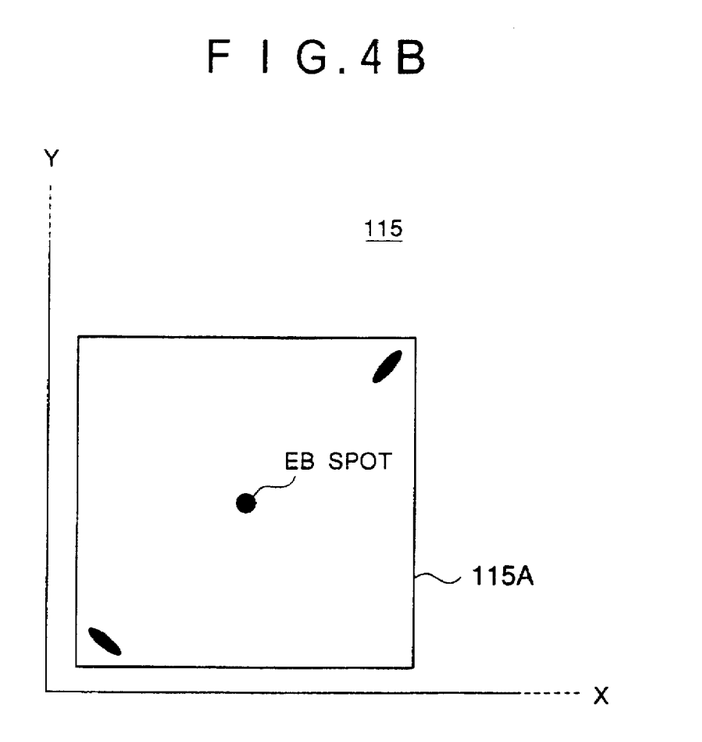

FIGS. 4A and 4B explain the astigmatism of the electron-beam in a sub-deflection region 115A caused as a result of such an electrostatic deflector, wherein FIG. 4A shows a case in which the sub-deflection region selected by the main deflector 111 is located on or in the vicinity of the optical axis, while FIG. 4B shows a case in which the selected sub-deflection region is located close to the edge of the main deflection region.

Referring to FIG. 4A where the center of the sub-deflection region 115A is coincident to the optical axis O, it will be noted that no distortion occurs in the electron-beam as long as the electron-beam travels along the optical axis O. Further, because of the small magnitude of beam deflection in the sub-deflection region 115A caused by the main deflector, the distortion of the electron-beam is generally small, while it will be noted that there is a slight distortion of the electron-beam in the marginal part of the sub-deflection region 115A.

In the situation of FIG. 4B where the electron-beam is deflected significantly by the main deflector, it should be noted that electron-beam on the central part of the sub-deflection region 115A is still free from distortion due to the compensation by the correction coil 109, while the electron-beam deflected to the marginal region of the sub-deflection region 115A experiences a heavy distortion.

Figure 5:
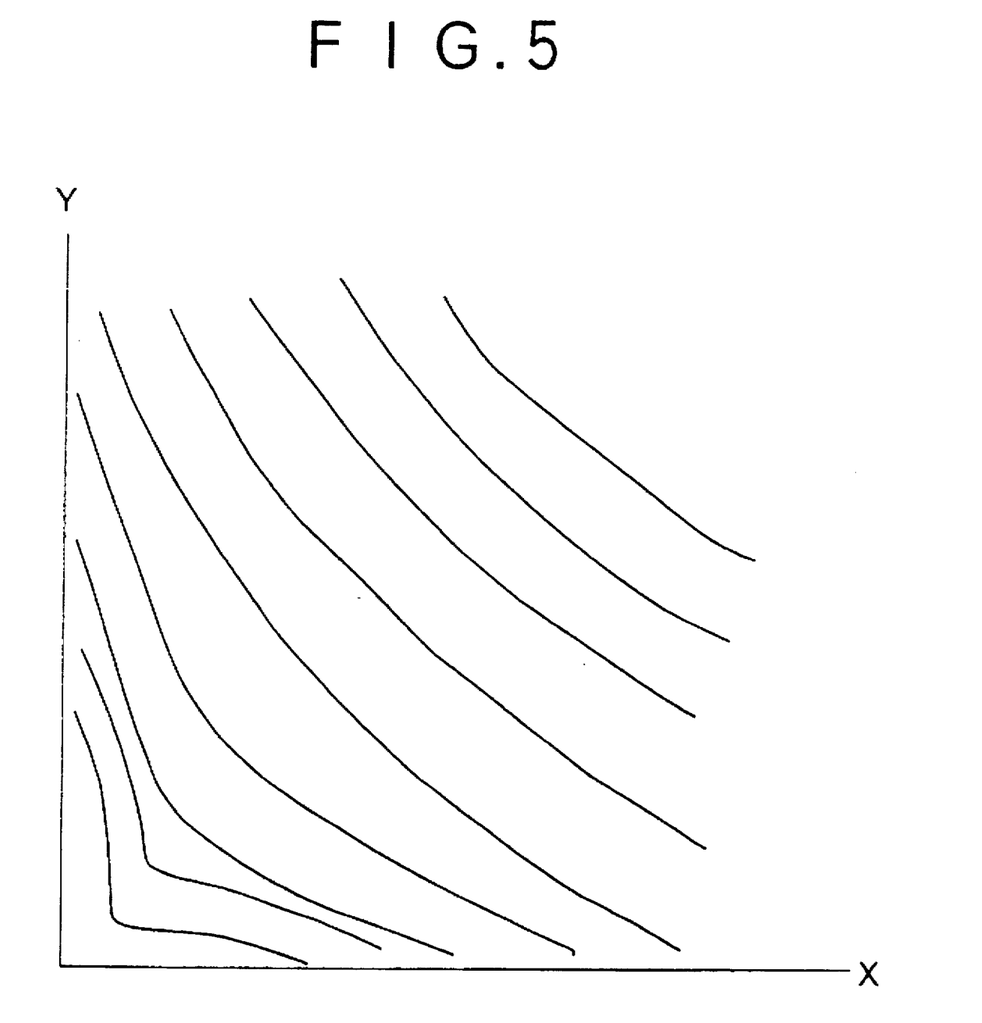
FIG. 5 is a diagram showing the distortion of the electric field inside an electrostatic deflector used for the sub-deflector in the electron-beam exposure system of FIG. 1.

FIG. 5 shows the distribution of potential in such a sub-deflection region. As will be noted from FIG. 5, the electric field potential, which should be distributed uniformly with a uniform gradient, is distorted significantly at the part close to the edge of the electrostatic deflector. In FIG. 5, the electrode plates are provided generally coincident to the X- and Y-coordinates. Such a distortion of the electric field arises from various factors such as the electrode plates of the electrostatic deflector being located at a finite distance from the electron-beam rather than at an infinite distance, the number of the electrode plates around the electron-beam being finite rather than infinite, and the like. Thus, when the electron-beam is offset from the optical axis O, the electron-beam passes the neighborhood of the electrode plate of the electrostatic deflector and experiences the effect of the distorted electric field strongly.

In principle, the distortion of the electron-beam shown in FIGS. 4A and 4B can be eliminated by driving the compensation coil 109, provided for astigmatic correction, in response to the deflection of the electron-beam. However, the inductance of the compensation coil 109 does not allow effective control of the drive current supplied to the compensation coil 109 in response to the high speed deflection of the electron-beam inside the sub-deflection region 115A. The response of the correction coil is too slow for responding to the high speed deflection by the electrostatic deflector. Further, such a use of the correction coil 109 for elimination of the beam distortion shown in FIGS. 4A and 4B is discouraged, as it is necessary to map the drive current, not only in each of the sub-deflection regions, but also in response to each exposure dot in each of the sub-deflection regions. For this purpose, an enormous memory is needed.

SUMMARY OF THE INVENTION

Accordingly, it is a general object of the present invention to provide a novel and useful electron-beam exposure system wherein the foregoing problems are eliminated.

Another and more specific object of the present invention is to provide an electron-beam exposure system in which the distortion in shape or size of the electron-beam, caused as a result of deflection by the electrostatic deflector, is minimized for each deflection point.

Another object of the present invention is to provide an electron-beam exposure system for exposing a pattern on an object, comprising:

a stage for holding the object to be exposed;

an electron-beam source for producing an electron-beam, said electron-beam source emitting said electron-beam toward said object held on said stage along an optical axis;

an electron optical system for focusing said electron-beam upon said object with demagnification; and a deflection fixture for deflecting said electron-beam such that said electron-beam moves over said object;

said deflection fixture comprising: a main deflector for deflecting said electron-beam in a main deflection region defined on said object; a first drive circuit supplied with main deflection data indicative of a position of said electron-beam on said main deflection region, for driving said main deflector; an electrostatic sub-deflector for deflecting said electron-beam in a sub-deflection region included in said main deflection region and having an area substantially smaller than an area of said main-deflection region; and a second drive circuit supplied with sub-deflection data indicative of a position of said electron-beam in said sub-deflection region for driving said sub-deflector;

said second drive circuit including a compensation circuit supplied with astigmatic compensation data determined by said main deflection data, said compensation circuit shifting the level of a first voltage signal applied across a first pair of mutually opposing electrode plates forming said electrostatic sub-deflector in an upward direction by a first correction voltage which is determined by said main deflection data, said compensation circuit shifting simultaneously the level of a second voltage signal applied across a second pair of mutually opposing electrodes that also form said electrostatic sub-deflector in a downward direction, by a second correction voltage having a magnitude identical with a magnitude of said first correction voltage.

According to the present invention, the drive voltage applied to the electrostatic deflector is changed in response to the main deflection data. Thereby, the deformation of the electron-beam such as by astigmatism, which is caused as a result of the electron-beam being deflected away from the optical axis, can be successfully compensated for in response to the deviation of the electron-beam. As the first correction voltage and the second correction voltage have different signs and the same magnitude, such a correction of astigmatism does not result in any deviation of the electron-beam position on the surface of the object. Such a correction of the data can be achieved by changing the gain of the output amplifier used for producing the drive voltage to be applied to the deflector, in response to the main deflection data. In such a correction, it should be noted that it is not necessary to provide mapping of the correction data for each deflection point in each of the sub-deflection regions.

Another object of the present invention is to provide a process for exposing a pattern on an object by means of a focused electron-beam, comprising the steps of:

dividing a surface of said object into a plurality of regions;

detecting a size of said electron-beam on said object for each of said plurality of regions;

storing data indicative of said size of said electron-beam in a memory device for each of said plurality of regions in the form of a map;

reading out said data from said memory device for correcting the size of said electron-beam in response thereto; and exposing said pattern on said object by means of said electron-beam of which size has been corrected; and which said step of exposing said pattern comprises a step of deflecting said electron-beam away from a predetermined optical axis to a selected one of said plurality of regions.

According to the present invention, it is possible to compensate for the change in size of the electron-beam caused by the error in the focusing state of the electron-beam, which in turn is caused as a result of deflection of the electron-beam away from the optical axis. By setting the plurality of regions appropriately, it is possible to reduce the size of the map held in the memory device, and the construction of the electron-beam exposure system can be achieved easily. Preferably, the sub-deflection region defined on the object and addressed by the main deflector, is used for the plurality of regions.

Other objects and further features of the present invention will become apparent from the following detailed description when read in conjunction with the attached drawings.

DETAILED DESCRIPTION OF PREFERRED EMBODIMENTS

Figure 6:
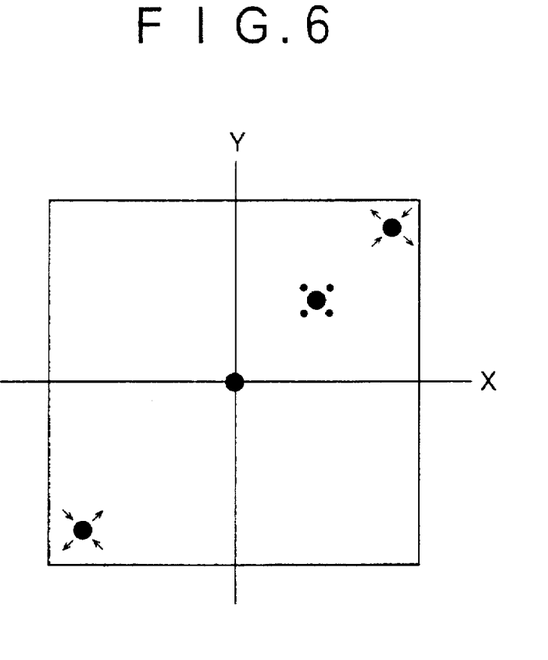
FIG. 6 is a diagram showing the principle of the present invention for correcting an electron-beam.

FIG. 6 shows an example of astigmatism of an electron-beam caused as a result of deflection of the electron-beam away from an optical axis, which is located at the center of the field.

Referring to FIG. 6 showing the electron-beam projected on a surface of a substrate, it will be noted that the electron-beam experiences a compression in the diagonal direction when the electron-beam is deflected away from an optical axis to the first quadrant and experiences simultaneously an expansion in the direction perpendicular to the foregoing diagonal direction. When the electron-beam is deflected to the third quadrant, on the other hand, it will be noted that the electron-beam is expanded in the diagonal direction and compressed in the direction perpendicular to the foregoing diagonal direction. Thus, by applying a compensating electric field counteracting against such a deformation of the electron-beam, it is possible to maintain an identical electron-beam shape, irrespective of the deflection of the electron-beam.

Figure 7:
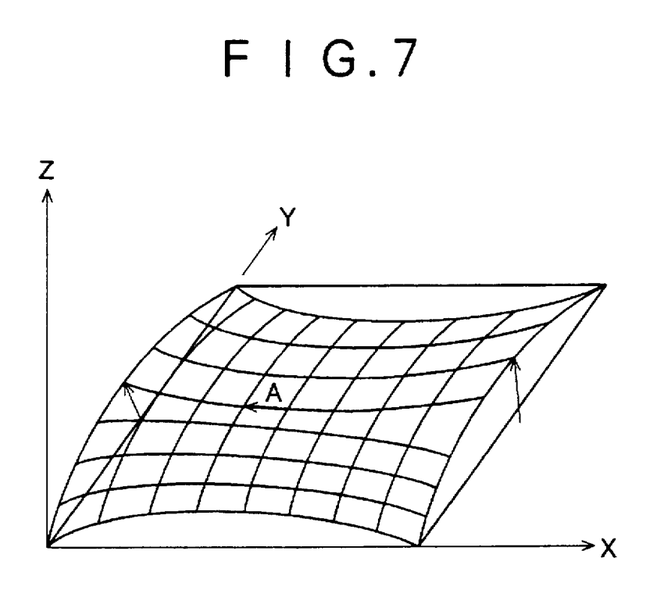
FIG. 7 is a diagram showing the electric field used in the present invention for carrying out the correction of the electron-beam.

FIG. 7 shows schematically the electric field employed in the present invention for carrying out such a compensation of the electron-beam, wherein the electric field of FIG. 7 represents the one employed when the electron-beam is deflected in the direction of a thick arrow A indicated therein. In FIG. 7, it should be noted that the X- and Y-axes represent the coordinates crossing perpendicularly to the optical axis, while the Z-axis represents the strength of the compensation electric field.

Referring to FIG. 7, it will be noted that the electric field used for beam compensation has a saddle form and provides a compression of the electron-beam in the direction of deflection and an expansion in the direction perpendicular to the direction of the deflection. When the deflection of the electron-beam is made perpendicularly to the arrow A to the third quadrant of FIG. 6, on the other hand, one may simply reverse the sign of the electric field strength about the Z-axis.

Hereinafter, the means to realize such a compensation field of FIG. 7 will be described with reference to embodiments of the present invention.

Figure 8A:
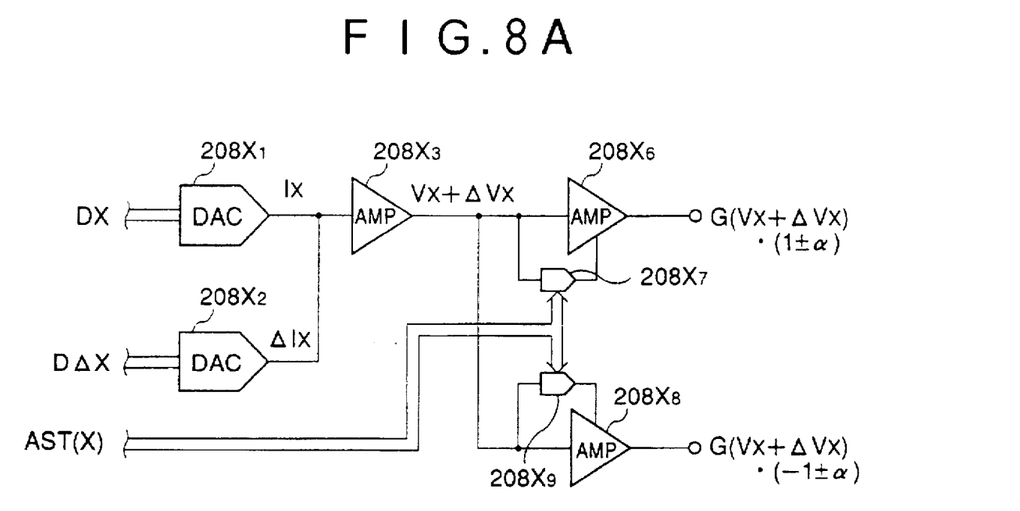
FIGS. 8A and 8B are circuit diagrams showing the essential part of a first embodiment of the present invention.
Figure 8B:
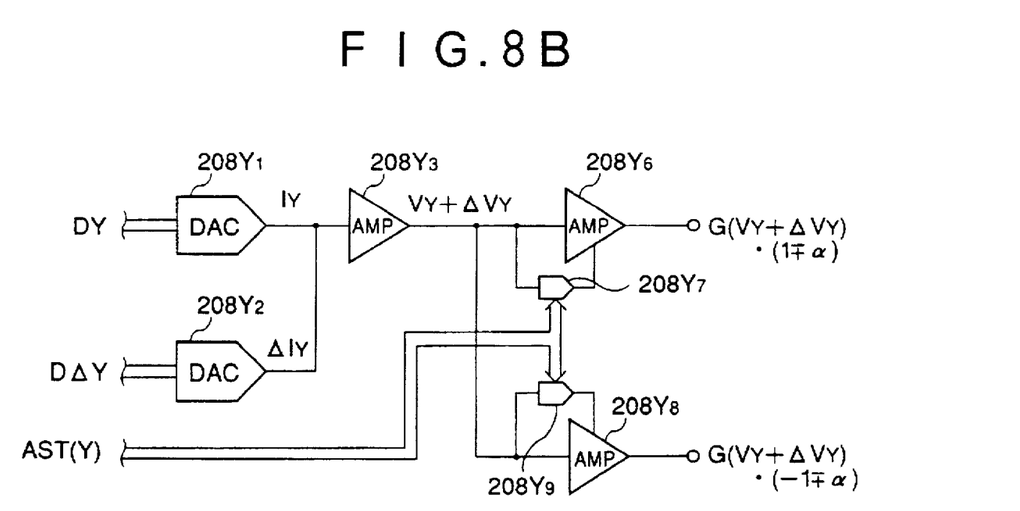

FIGS. 8A and 8B show X- and Y-drive circuits for driving an electrostatic X-deflector and an electrostatic Y-deflector, respectively. It should be noted that the circuits of FIGS. 8A and 8B are used for the sub-deflector control circuit 208 that drives the sub-deflector 112 of the electron-beam exposure system of FIG. 1, similarly to the circuits of FIGS. 3A and 3B, wherein the circuit of FIG. 8A forms a part of the X-deflector system and the circuit of FIG. 8B forms a part of the Y-deflector system. In the description below, those parts in FIGS. 8A and 8B that are already described with reference to FIGS. 3A and 3B are designated by the same reference numerals and the description thereof will be omitted.

Referring to FIG. 8A, the X-drive circuit includes operational amplifiers $208X_6$ and $208X_8$ in place of the operational amplifiers $208X_4$ and $208X_5$, and feedback control circuits $208X_7$ and $208X_9$ which cooperate with the operational amplifiers $208X_6$ and $208X_8$, respectively, wherein the feedback control circuits $208X_7$ and $208X_9$ are supplied with astigmatic correction data AST determined as a function of main deflection data X and control the amount of feedback for each of the operational amplifiers $208X_6$ and $208X_8$. Further, a similar construction is provided also on the Y-deflection system shown in FIG. 8B.

In the X-deflection system shown in FIG. 8A, the feedback control circuit $208X_7$ cooperating with the amplifier $208X_6$ controls the gain thereof. Thereby, the operational amplifier $208X_6$ produces an output voltage signal $G(V_x + {}_\Delta V_x) \cdot (1 \pm \alpha)$, wherein the term $(1 + \alpha)$ represents the effect of the gain control achieved by the control circuit $208X_7$. Similarly, in the Y-deflection system shown in FIG. 8B, the feedback control circuit $208Y_7$ cooperates with the amplifier $208Y_6$ and controls the gain thereof such that the amplifier $208Y_6$ produces an output voltage signal of $G(V_y + {}_\Delta V_y) \cdot (1 \pm \alpha)$, wherein the term $(1 \pm \alpha)$ represents the effect of gain control achieved by the foregoing control circuit $208X_7$.

Thus, when the foregoing control circuit $208X_7$ of the X-deflection system increases the voltage signal applied to one of the electrodes of the electrostatic X-deflector in the positive direction, the voltage signal applied to the opposing electrode of the electrostatic deflector increases also in the positive direction with the same amount. In other words, a voltage of $G(V_x + {}_\Delta V_x) \cdot (1 + \alpha)$ is applied to the first electrode and a voltage of $G(V_x + {}_\Delta V_x) \cdot (-1 + \alpha)$ is applied to the opposing electrode. On the other hand, the control circuit $208Y_7$ forming the Y-deflection system increases simultaneously the voltage applied to one of the electrodes of the electrostatic Y-deflector in the negative direction and the voltage applied to the other of the electrodes of the electrostatic Y-deflector also in the negative direction with the same magnitude as the first electrode of the electrostatic Y-deflector. In other words, a voltage of $G(V_y + {}_\Delta V_y) \cdot (1 - \alpha)$ is applied to the first electrode of the Y-deflector and a voltage of $G(V_y + {}_\Delta V_y) \cdot (-1 - \alpha)$ is applied to the second electrode of the Y-deflector.

By controlling the drive voltages applied to the electrodes of the electrostatic deflector, it is possible to create the compensating electric field of FIG. 7 inside the sub-deflector without substantially affecting the electric field at the central part of the sub-deflection region. Thereby, such a compensating electric field compensates for the beam distortion only when the electron-beam is deviated toward the marginal area of the sub-deflection region, while not substantially affecting the electric field at the central part of the sub-deflection region.

In such a compensation of the electron-beam shape, it should be noted that the correction factor α is determined by the astigmatic correction data AST that in turn is determined by the main deflection data X. In other words, the data AST is a function of the data X. Further, it should be noted that a similar correction is possible by decreasing the drive voltage of the X-deflection system and increasing the drive voltage of the Y-deflection system. As such construction is obvious from the foregoing descriptions, further description thereof will be omitted.

Figure 9:
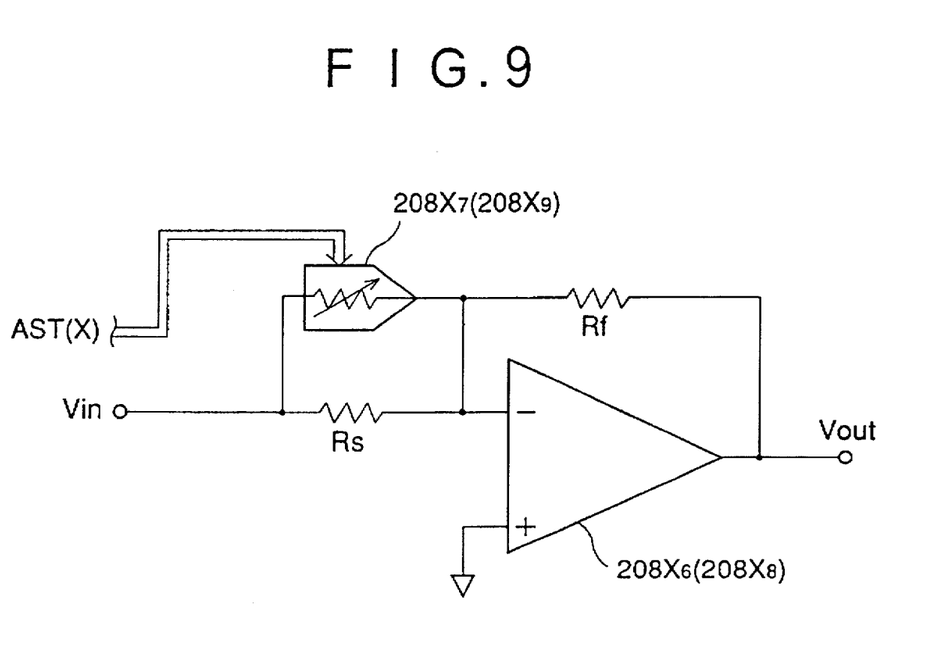
FIG. 9 is a diagram showing a part of the circuit diagrams in FIGS. 8A and 8B in detail.

FIG. 9 shows the construction of the feedback control circuit $208X_7$ or $208X_9$ shown in FIG. 8A as well as the construction of the operational amplifiers $208X_6$ or $208X_8$ cooperating therewith.

Referring to FIG. 9, the operational amplifier $208X_6$ has a feedback loop including therein a feedback resistance Rf and a main input resistance Rs, wherein the control circuit $208X_7$ forms a variable resistance inserted into such a feedback loop for changing the resistance about a value Rv within a range of $\pm_A Rv$. It should be noted that an operational amplifier having such a construction produces an output voltage Vout in response to an input voltage Vin as $$Vout = -\{Rs+(Rv\pm_A Rv)\}Rf \cdot Vin/Rs(Rv\pm_A Rv),$$

wherein it will be noted that the parameter $_A Rv$ corresponds to the foregoing factor α.

In order to determine the optimum value for the parameter α in the construction of FIG. 9, one may deflect the electron-beam as indicated in FIG. 3A or FIG. 3B for each of the astigmatic correction data AST(X) and obtain the value of $_A Rv$ that minimizes the beam distortion or maximizes the beam sharpness. In principle, such an optimum value of $_A Rv$ is obtained by deflecting the electron-beam to a specific single point in the sub-deflection region and seeking the minimum beam distortion. In practice, however, it is more preferable to deflect the electron-beam to five or more points in the sub-deflection region including the central point and four marginal points and achieve a more precise determination. Such a measurement of the beam shape can be achieved by scanning an edge of the substrate by the electron-beam while monitoring reflection electrons.

Figure 10:
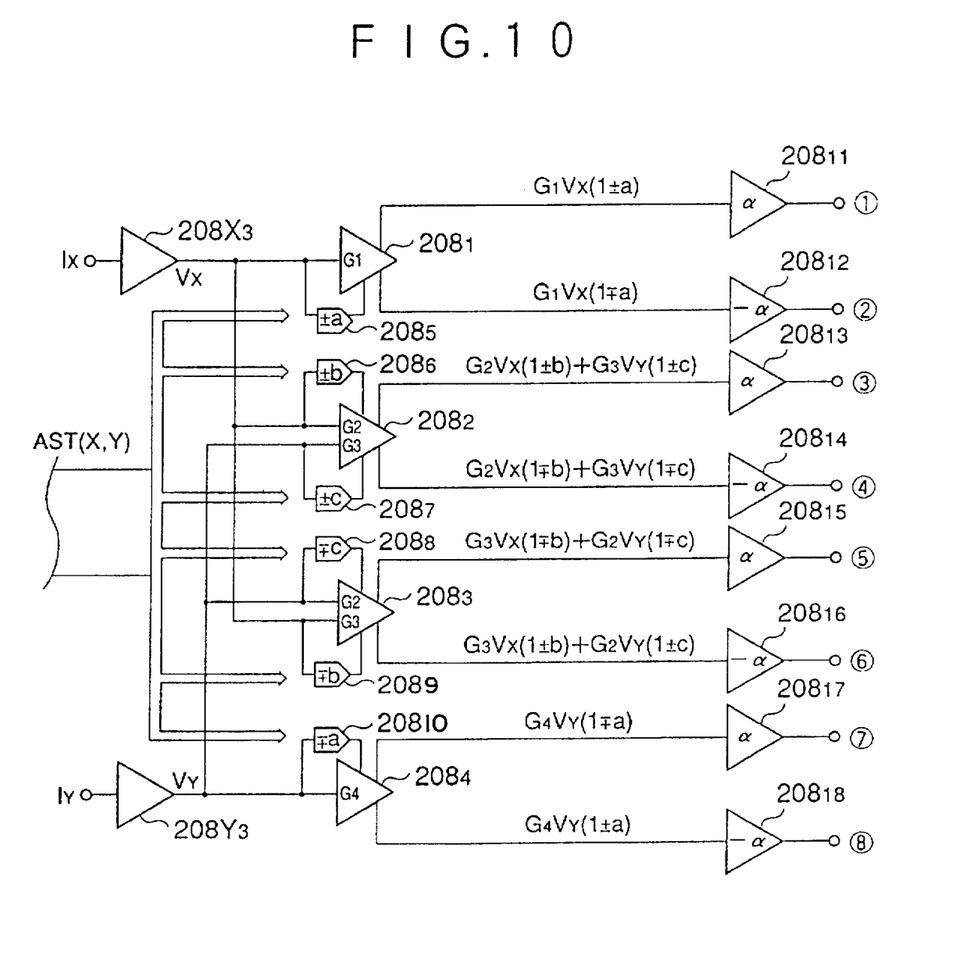
FIG. 10 is a circuit diagram showing the essential part of a second embodiment of the present invention.
Figure 11:
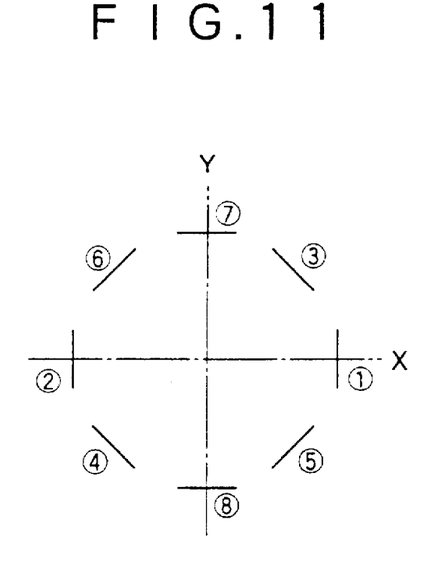
FIG. 11 is a diagram showing the construction of the electrostatic deflector used in the construction of FIG. 10.

Next, a second embodiment of the present invention will be described with reference to FIG. 10 wherein an electrostatic deflector having four pairs of opposing electrodes shown in FIG. 11 are used.

Referring to FIG. 11, it will be noted that the electrostatic deflector is formed of electrodes (1)–(8), wherein the electrodes (1) and (2) are opposed with each other to form an electrode pair, the electrodes (3) and (4) are opposed with each other to form another electrode pair, the electrodes (5) and (6) are opposed with each other to form an additional electrode pair, and the electrodes (7) and (8) are opposed with each other to form still another electrode pair. Thereby, it should further be noted that the electrodes (1) and (2) are aligned in a direction that intersects perpendicularly to a direction in which the electrodes (7) and (8) are aligned. Similarly, the electrodes (3) and (4) are aligned in a direction that intersects perpendicularly to a direction in which the electrodes (5) and (6) are aligned. Further, the electrode pair (1) and (2) forms an angle of 45 degrees with respect to the electrode pair (5) and (6). Referring to the circuit diagram of FIG. 10, it should be noted that the deflection data X and Y are supplied, after being converted to analog signals Ix and Iy by means of a D/A converter of which illustration is omitted, to the amplifiers $208X_3$ and $208Y_3$ respectively, wherein the amplifiers $208X_3$ and $208Y_3$ produce voltage output signals $V_x$ and $V_y$, respectively. The voltage output $V_x$ of the amplifier $208X_3$ is supplied to amplifiers $208_1$–$208_3$, while the voltage output $V_y$ of the amplifier $208Y_3$ is supplied to amplifiers $208_2$–$208_4$.

It should be noted that the amplifier $208_1$ is formed of an operational amplifier cooperating with a feedback control circuit $208_5$, and produces an output signal $G_1 V_x(1\pm a)$ and supplies the same to the electrode (1) via an amplifier $208_{11}$. Simultaneously, the operational amplifier $208_1$ produces an output signal $G_1 V_x(1\pm a)$ and supplies the same to the electrode (2) after inversion of polarity by an amplifier $208_{12}$. Here, it should be noted that $G_1$ represents the gain of the operational amplifier $208_1$ and a represents the change of the gain achieved by the feedback control circuit $208_5$ for compensating for the astigmatism.

Similarly, the amplifier $208_4$ is formed of an operational amplifier having a gain $G_4$ and cooperating with a feedback control circuit $208_{10}$, wherein the amplifier $208_4$ produces an output signal $G_4 V_y(1\pm a)$ and supplies the same to the electrode (7) via an amplifier $208_{17}$. Further, the amplifier $208_4$ produces an output signal $G_4 V_y(1\pm a)$ and supplies the same to the electrode (8) after inversion of polarity in an amplifier $208_{18}$. Thereby, the parameter a represents the change of the gain achieved by the feedback control circuit $208_{10}$ for the compensation of the astigmatism.

In the circuit of FIG. 10, it should further be noted that the amplifiers $208_2$ and $208_3$ mix the voltage signals $V_x$ and $V_y$ supplied thereto. More specifically, the amplifier $208_2$ cooperates with the feedback control circuits $208_6$ and $208_7$ and supplies an output signal $G_2 V_x(1\pm b)+G_3 V_y(1\pm c)$ to the electrode (3) via the amplifier $208_{13}$ and, simultaneously, an output signal $G_2 V_x(1\pm b)+G_3 V_y(1\pm c)$ to the electrode (4), after inversion of polarity in the amplifier $208_{14}$. Here, $G_2$ and $G_3$ respectively represent the gain of the operational amplifier $208_2$ for the input voltage signals $V_x$ and $V_y$, respectively, while the parameters b and c represent a change in the gain of the operational amplifier $208_2$ respectively caused by the feedback control circuits $208_6$ and $208_7$ for the compensation of the astigmatism.

Similarly, the amplifier $208_3$ cooperates with the feedback control circuits $208_8$ and $208_9$, and supplies an output signal $G_3 V_x(1\pm b)+G_2 V_y(1\pm c)$ to the electrode (5) via an amplifier $208_{15}$ and an output signal $G_3 x(1\pm b)+G_2 V_y(1\pm c)$ to the electrode (6) after inversion of polarity in an amplifier $208_{16}$. Here, it should be noted that $G_3$ and $G_2$ respectively represent the gain of the operational amplifier $208_3$ respectively for the input signals $V_x$ and $V_y$, while the parameters b and c represent the change in the gain of the operational amplifier $208_3$ respectively caused by the feedback control circuits $208_8$ and $208_9$ for compensating for the astigmatism.

It should be noted that the feedback control circuits $208_5$–$208_{10}$ are supplied with the astigmatism correction data AST(X,Y), which is a function of the main deflection data X and Y and causes a change in the parameters a–c and, hence, in the amount of feedback in response to the data AST(X,Y). In the construction of FIGS. 10 and 11, too, the voltage applied across an electrode pair, such as the electrode pair formed of the electrode (1) and the electrode (2), is superimposed with a positive voltage offset produced by the feedback control circuit $208_5$. On the other hand, the voltage applied across the electrode pair that intersects perpendicularly to the foregoing electrode pair, such as the electrode pair formed of the electrode (7) and the electrode (8), is superimposed with a negative voltage offset produced by the feedback control circuit $208_{10}$. In the present example, the amplifier $208_{11}$ sets a positive polarity (α) to the first output voltage signal $G_1 V_x(1\pm a)$ of the amplifier $208_1$, while the amplifier $208_{12}$ sets a negative polarity ($-\alpha$) to the second output voltage signal $G_1V_x(1\pm a)$. Thereby, there appears a voltage offset of $\pm G_1V_x a$ on the electrodes (1) and (2) with the same polarity. Similarly, the amplifier $208_{17}$ sets a positive polarity to the first output signal $G_4V_y(1\pm a)$ and the amplifier $208_{18}$ sets a negative polarity to the second output signal $G_4V_y(1\pm a)$ of the amplifier $208_4$. Thereby, there appears a voltage offset of $\pm G_4V_y a$ on the electrodes (7) and (8) with the same polarity that is opposite to the polarity of the voltage offset applied to the electrodes (1) and (2).

In such a construction, it should be further noted that there exist other electrode pairs, such as the pair formed of the electrodes (3) and (4) or the pair formed of the electrodes (5) and (6), that form a 45 degree angle with respect to the foregoing electrode pairs formed respectively of the electrodes (1) and (2) or the electrodes (7) and (8). Thereby, there appears a voltage offset between the electrode (6) and the electrode (7) forming a 45 degree angle therebetween, with a mutually opposing polarity.

Thus, the present invention is effective for the electrostatic deflector having more than four poles.

It should be noted that the present invention is by no means limited to the BAA exposure system described with reference to FIG. 1 but is effective also in other general electron-beam exposure systems, such as a block exposure system. Further, one may apply the astigmatic correction directly upon the main deflection data X and Y, rather than modifying the gain of the amplifier after converting the main deflection data X and Y to the analog signals. In such a case, too, the polarity or sign of the drive signal applied to the electrodes is determined by the amplifiers $208_{11}$–$208_{18}$.

Next, a third embodiment of the present invention for compensating for the change of the electron-beam size with the deflection of the electron-beam will be described with reference to FIG. 12.

Figure 12:
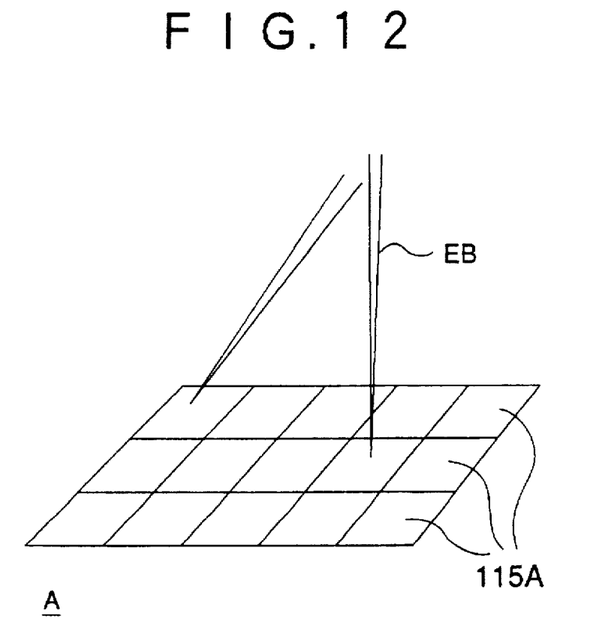
FIG. 12 is a diagram showing a variation in the size of the electron-beam caused as a result of deflection of the electron-beam.

Referring to FIG. 12, it should be noted that a main deflection region A on the substrate 115 is divided into a plurality of regions each having a size of 100 μm×100 μm, and the electron-beam size is measured for each of the regions thus defined. Such a measurement of the electron-beam size may be achieved by providing a pattern having a reflectivity relatively to the electron-beam which is different from the rest of the substrate 115 in each of the foregoing regions. By scanning such a pattern by the electron-beam while monitoring for the reflected electrons, it is possible to measure the size and shape of the electron-beam simultaneously. Preferably, the sub-deflection regions are used for the foregoing plurality of regions.

The beam size data indicative of the size of the electron-beam thus obtained is stored in a storage device for each of the sub-deflection regions in the form of a map. Thus, when conducting an exposure, the beam size data stored in the storage device is read out therefrom, and the data thus read out is used for controlling the gain of the foregoing sub-deflector drive circuit, described above with reference to the first and second embodiments. Thereby, the variation of the electron-beam size is successfully compensated for in response to the deflection of the electron-beam caused by the main deflector. It should be noted that it is the main deflector that is used to address the foregoing sub-deflection regions. During such a compensation of the electron-beam size, one can avoid the drift of the electron-beam by increasing the voltage applied across a first pair of electrodes and simultaneously reducing the voltage applied across another pair of electrodes.

Further, it should be noted that the foregoing compensation of astigmatism can be achieved not only by the analog circuit as described heretofore but also by a digital circuit. In such a case, the output of the digital circuit is merely converted to analog signals and applied to the electrodes of the electrostatic deflector.

Further the present invention is not limited to the embodiments described heretofore, but various variations and modifications may be made without departing from the scope of the invention.

What is claimed is:

1. A method for exposing a pattern on an object by scanning a surface of the object with a focused electron-beam, the focused electron-beam having a desired size as incident on the scan surface of the object when aligned with a central optical axis substantially perpendicular to the surface and being subject to changes in size of the beam as the beam is deflected from the central optical axis for scanning corresponding portions of the surface of the object displaced from the central optical axis, the method comprising the steps of:

dividing the surface of said object to be scanned by the focused electron-beam into a plurality of regions;

detecting the corresponding, different sizes of said electron-beam when selectively deflected to each of said plurality of regions;

storing data indicative of said detected, corresponding different sizes of said electron-beam, in association with said plurality of regions; and exposing said pattern on said object by scanning the surface thereof with the focused electron-beam, the scanning step further comprising:

deflecting said focused electron-beam away from the central optical axis selectively to said plurality of regions for individually scanning each thereof, in a desired succession, and for each of the plurality of regions to which the focussed electron beam is deflected, reading out the corresponding stored data and correcting the size of the focused electron-beam to maintain a desired size thereof.

2. A method as claimed in claim 1, wherein each of said plurality of regions is of a size of approximately 100 μm×100 μm.

3. A method as claimed in claim 1, wherein:

each of said plurality of regions comprises a sub-deflection region to which said electron-beam is deflected in response to activation of a main deflector; and said step of exposing said pattern comprises the steps of selecting one of said sub-deflection regions by activating said main deflector, and deflecting said electron-beam, in response to an activation of a sub-deflector, within said selected sub-deflection region.

4. An exposure method employing a scanning electron beam which produces a scanning beam spot on a surface scanned by the beam and wherein the beam spot has a desired configuration when the beam is aligned with a central optical axis substantially perpendicular to the surface and which desired configuration is subject to change when the scanning beam is deflected away from the central optical axis for scanning corresponding portions of the surface displaced from the central optical axis, comprising the steps of:

dividing the surface of the object to be scanned by the scanning beam spot into a plurality of regions;

detecting the corresponding, different sizes of the beam spot as the beam is selectively deflected to each of said plurality of regions;

storing data indicative of the detected, corresponding different sizes of the beam spot in association with the plurality of regions; and exposing the pattern on the object by scanning the surface thereof with the scanning beam, the scanning step further comprising:

deflecting said focused electron-beam away from the central optical axis selectively to said plurality of regions for individually scanning each thereof, in a desired succession, and for each of the plurality of regions to which the focussed electron beam is deflected, reading out the corresponding stored data and correcting the size of the focused electron-beam to maintain a desired size thereof.

5. A method as claimed in claim 4, wherein each of said plurality of regions is of a size of approximately 100 µm×100 µm.

6. A method as claimed in claim 4, wherein:

each of said plurality of regions comprises a sub-deflection region to which said electron-beam is deflected in response to activation of a main deflector; and said step of exposing said pattern comprises the steps of selecting one of said sub-deflection regions by activating said main deflector, and deflecting said electron-beam, in response to an activation of a sub-deflector, within said selected sub-deflection region.

* * * * *

UNITED STATES PATENT AND TRADEMARK OFFICE
CERTIFICATE OF CORRECTION

PATENT NO. : 5,631,113
DATED : May 20, 1997
INVENTOR(S) : SATOH et al.

It is certified that error appears in the above-indentified patent and that said Letters Patent is hereby corrected as shown below:

TITLE PAGE: [75] Inventors: Replace the third and fourth lines with the following:

Oae, all of Kawasaki; Keiji Yamada, Kasugai; Toru Oshima, Kawasaki, all of Japan Col. 1, line 40, change "there," to --thereon,--.

Col. 7, line 19, change "FIGS. SA" to --FIGS. 8A--.

Col. 8, line 10, change "FIG. SA" to --FIG. 8A--;
line 31, change "$(1 + a)$" to --$(1 \pm a)$--;
line 37, change "$(1 \pm a)$" (both occurrences) to --$(1 \mp a)$--.

Col. 9, line 62, begin a new paragraph with "Referring".

Col. 10, line 10, change "$(1 \pm a)$" to --$(1 \mp a)$--;
line 19, change "$(1 \pm a)$" to --$(1 \mp a)$--;
line 32, change "$(1 \pm b)$" to --$(1 \mp b)$--; and change "$(1 \pm c)$" to --$(1 \mp c)$--;
line 42, change "$(1 \pm b)$" to --$(1 \mp b)$--; and change "$(1 \pm c)$" to --$(1 \mp c)$--;

Signed and Sealed this

Seventh Day of October, 1997

*Attest:*

BRUCE LEHMAN

*Attesting Officer*     *Commissioner of Patents and Trademarks*